(12) United States Patent
Damiani et al.

(10) Patent No.: US 8,812,284 B2
(45) Date of Patent: Aug. 19, 2014

(54) HIGHLY REPRESENTATIVE REAL-TIME SIMULATION OF AN AVIONICS SYSTEM

(75) Inventors: Nicolas Damiani, Marseilles (FR); Roland Touati, Salon de Provence (FR); Nicolas Brisset, La Fare les Oliviers (FR)

(73) Assignee: Airbus Helicopters, Marignane Cedex (FR)

( * ) Notice: Subject to any disclaimer, the term of this patent is extended or adjusted under 35 U.S.C. 154(b) by 990 days.

(21) Appl. No.: 12/886,646

(22) Filed: Sep. 21, 2010

(65) Prior Publication Data
US 2011/0071709 A1    Mar. 24, 2011

(30) Foreign Application Priority Data
Sep. 23, 2009  (FR) ...................................... 09 04545

(51) Int. Cl.
*G06F 17/50*  (2006.01)
(52) U.S. Cl.
USPC .......................................................... 703/13
(58) Field of Classification Search
None
See application file for complete search history.

(56) References Cited

U.S. PATENT DOCUMENTS

| 4,845,665 | A | | 7/1989 | Heath et al. |
| 5,223,788 | A | * | 6/1993 | Andreano et al. .............. 714/25 |
| 5,260,874 | A | | 11/1993 | Berner et al. |
| 5,541,863 | A | | 7/1996 | Magor et al. |
| 5,786,995 | A | * | 7/1998 | Coleman .......................... 700/83 |
| 8,335,601 | B2 | * | 12/2012 | Sham et al. ....................... 701/3 |

FOREIGN PATENT DOCUMENTS

| EP | 0807882 A2 | 11/1997 |
| EP | 1944663 A1 | 7/2008 |

OTHER PUBLICATIONS

Alena et al., "Communications for Integrated Modular Avionics", 2007 IEEE Aerospace Conference, Mar. 2007, pp. 1-18.*
Pascoal et al., "AMOBA—ARINC 653 Simulator for Modular Based Space Applications", Proceedings of DASIA 2008 Data Systems in Aerospace, 2008.*
Brunette et al., "A metamodel for the design of polychronous systems", The Journal of Logic and Algebraic Programming, vol. 78, Issue 4, Apr. 2009, pp. 233-259.*

* cited by examiner

*Primary Examiner* — Omar Fernandez Rivas
*Assistant Examiner* — Herng-Der Day
(74) *Attorney, Agent, or Firm* — Brooks Kushman P.C.

(57) ABSTRACT

Optionally-mixed highly representative real time simulation of at least part of an avionics system (2). The simulation provides at least a step of translating communications interfaces into the form of models encoded in high level language on the basis of formal files in mark-up language; and dynamically managing descriptions that provide for grouping together, updating, and sharing a database that, for each piece of equipment, incorporates signals that transit via its input and/or output interfaces.

11 Claims, 5 Drawing Sheets

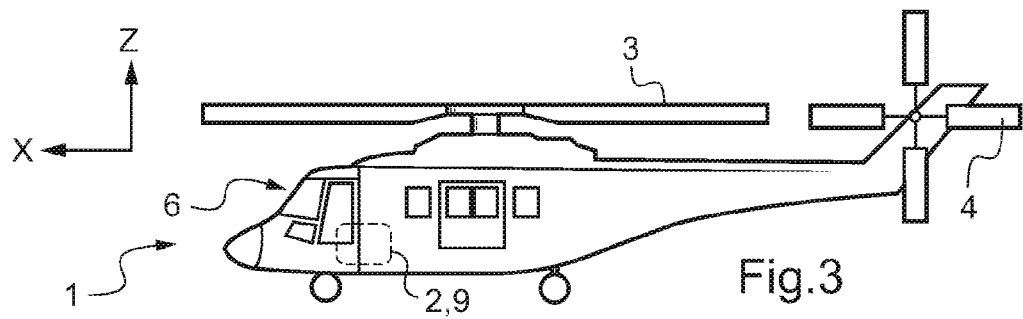
Fig.3
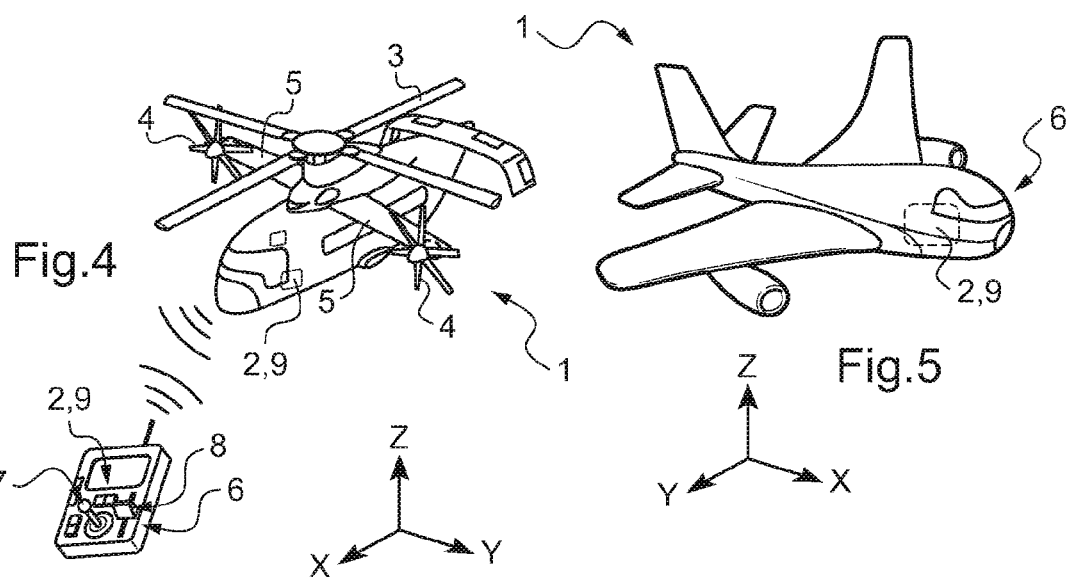
Fig.4
Fig.5
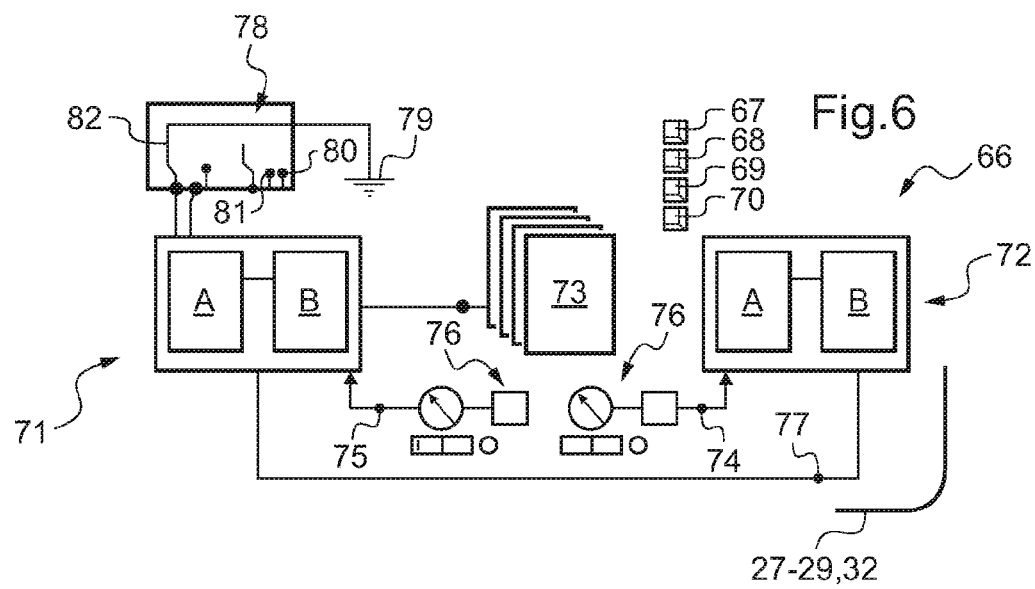
Fig.6

HIGHLY REPRESENTATIVE REAL-TIME SIMULATION OF AN AVIONICS SYSTEM

CROSS REFERENCE TO RELATED APPLICATION

This application claims the benefit of patent application no. FR 09 04545 dated Sep. 23, 2009, the disclosure of which is incorporated herein by reference.

FIELD OF THE INVENTION

The general field of the invention is aviation, i.e. aircraft, including airplanes and rotary wing aircraft, such as, but not limited to, conventional helicopters or hybrid helicopters and/or by drones of such aircraft.

The specific field of the invention relates to aircraft avionics systems, and more particularly to simulating such systems. Such systems are also said to be "on-board" systems, even if nowadays some of their components may be situated elsewhere.

The invention does not seek to produce simulations of so-called "mechanical" components of conventional aircraft. However such mechanical components may also include electrical or hydraulic components or may be involved in flight mechanics.

Information representative of these components and/or information produced by these components is needed for certain simulations of avionics systems in accordance with the invention.

By way of example, the avionics systems concerned by the invention include autopilots (A/P) and/or multifunction displays (MFDs), and/or vehicle management subsystems (VMS).

With the invention, it is desired to obtain, in real time, simulations that are highly representative of said avionics systems.

For example, these highly representative simulations are used for simulating avionics systems for the purposes of designing and/or specifying and/or modifying them. These simulations can also be used for pilot training or for maintenance purposes.

For these utilizations, it is particularly appropriate for the invention to ensure high levels of reliability, of traceability, and of maintainability.

Thus, the level of representativity of the simulated avionics system must be appropriate for the levels required for specification purposes, or indeed for certifying the system.

BACKGROUND OF THE INVENTION

One of the difficulties encountered with simulations of avionics systems is the diversity of their components (e.g. the pieces of equipment, also called "equipments" in the aviation domain), and the diversity of the data formats that need to be taken into account for simulation purposes.

Thus, the simulation must be a faithful representation of electrical functions and/or electronic functions and/or hydraulic functions and/or mechanical functions performed by this variety of components.

As for the data formats relating to these components, they may be of the analog type and/or discrete type and/or binary type and/or presented as structured data.

Thus, upstream from the simulation, data is available in various types, in particular raw data in avionics format.

However, only a digital abstraction of data in engineering data format is suitable for use in a simulation.

Such a digital abstraction must have a unitary format regardless of its origin, its units, its values, and its function. This unitary format for expressing data is representative of the raw data in avionics format.

To summarize, data in engineering format is the data "spoken" by models in pure simulation or that is manipulated internally in the models that are representative of pieces of equipment.

In contrast, upstream from these simulation models, the data is in avionics format. Data in avionics format is therefore representative of the system when on board the destination aircraft.

In order to be homogenous and compatible within the situation, the data in avionics format complies with the on-board data exchange protocol, while nevertheless being representative of real data. This must make it possible by encoding to translate the data into engineering format. The data in avionics format is retrieved by decoding.

In order to illustrate the complexity of such encoding/decoding, various types of avionics format data are mentioned below.

Thus, in order to measure temperature, i.e. information of a physical nature for incorporating in a simulation, the equipment generates data in avionics format in the form of an analog signal presenting some number of Volts.

The data in engineering format representing temperature in a measurement unit specific to the instrument that evaluates temperature is for example in degrees Fahrenheit. However, it may be necessary in the simulation for the data in engineering format to represent temperature values given in degrees Celsius. This involves additional conversion.

Other data in avionics format, such as an on/off control, is in the form of a discrete signal (e.g. on/nominal voltage/ground), associated with state values (0/1).

Furthermore, in conventional avionics protocols, data in avionics format is always in the form of n-bit words (often 32-bit words) containing a plurality of fields, or having a null state. Such words, which are used for describing functions, their physical media, and their electrical interfaces, are conventionally conveyed on a standard data bus.

Likewise, numerous modern avionics systems include components having one or more computers running software. Various subassemblies (e.g. partitions) are connected together by cabling, communications buses, and connectors.

The data specific to such computer components comes in a variety of structured data forms, as defined by the protocol to which it belongs.

It can thus be understood that this wide variety of data (in particular in avionics format) for transforming into data in engineering format, and conversely for retrieving from engineering format, gives rise at present to numerous technical problems.

Furthermore, for a given avionics system, it is common practice for a component computer to operate with a specific operating system (OS), commonly referred to as an "avionics" OS.

It is not rare for a plurality of avionics OSes to co-exist in the same avionics system, each of them being dedicated to a specific computer, for example.

In practice, these avionic OS' are different from the operating systems (Unix®, Linux®, Windows®) commonly employed in the workstations that are used for programming and/or testing and/or simulation of avionics systems.

The abstraction that enables data to be obtained (in particular in avionics format) for simulation of the avionics system must naturally be independent of such an operating system.

Another drawback at present is that the workstations used for simulations need to have processing capacity and a number of processors that are greater than the capacities and the number of processors in the avionics systems to be simulated.

Yet another drawback that is observed during simulation lies in the difficulty of incorporating changes in the avionics system and/or in its components.

Mention is now made of certain documents relating to real time simulation.

Document EP 0 807 882 describes a software interpreter for a multicard avionics computer. Several sets of program instructions are implemented on a workstation having processing capacity and a number of processors that are greater than the capacity and the number of processors of the avionics. With an operating system such as Unix, real time tasks are executed and cache memories and procedures are shared. A set of instructions and data representative of the avionics is loaded directly into a target memory simulation system. An example of the avionics concerned is the multifunction LAMPS MKIII on-board platform for an anti-submarine helicopter.

Document EP 1 944 663 describes simulating dynamic feedback control of a turbine for running on consumer electronics. Those simulations are used for acceptance testing purposes on physical pieces of equipment or hardware. Models of genuine programs are simulated after being translated to a destination environment. During simulation, the data associated with the model may be modified in part only. Prior to executing the simulation, commands that are typically in the C and C++ languages are modified using a graphics interface.

Document U.S. Pat. No. 4,845,665 describes the use of a workstation to develop programs for external interfaces in the form of display screens. In order to evaluate the ergonomics of a program before its code has been produced, it is possible to alter the interfaces in reversible manner while simulating the program. The changes that are observed are recorded on a disk. Tables and their formats are simulated.

Document U.S. Pat. No. 5,260,874 describes a flight emulation test system for application to an airliner on the ground. A road vehicle can be seen connected to a grounded airplane by means of removable cables in order to verify the proper operation of various essential mechanical and electrical components thereof. The emulation verifies that the components respond appropriately to the stresses applied by the test system.

Document U.S. Pat. No. 5,541,863 describes a virtual test bench with incorporated software for avionics. The test bench is reconfigurable and makes use of partial simulation together with genuine physical pieces of equipment. Graphics displays with multiple functions show information that may be provided to a screen of a workstation such as a DEC station under VMS, which data is presented in the form of graphics and tables. Line replaceable units (LRUs) are tested in real form or by replacing a simulation module on a test bench referred to as a "rack". Numerous changes in the program being developed are made apparent. That bench makes it possible to test simulated on-board software or on-board software on an on-board computer without exhaustively simulating the physical interfaces of the pieces of equipment or modules. It is possible at will to test the operation of the simulated equipment or of the real equipment. Equipment simulation remains restricted to the functional portion.

Still in the field of numerical simulations, referred to as a virtual aircraft in the field of aviation, various protocols are used. These protocols contribute to integrated modular avionics (IMA).

Accordingly, it would be desirable to simulate protocols and enable them to be modified while they are being simulated. For example, it would be desirable to simulate the dedicated avionics protocols, such as: ARINC429, ARINC653, MIL-STD-1553B and protocols, standards, or languages in the general field of computing such as: RS422, Ethernet, extensible mark-up language (XML), C/C++.

All of these tools, languages, protocols, standards, and systems are conventionally described in publications that can easily be obtained, in particular over the Internet.

Wikipedia, the on-line encyclopedia, contains descriptions of the documents mentioned that may be compared with the invention.

As mentioned above, real time simulation of avionics systems at the present time gives rise to various technical problems, in particular when high representativity is required of the simulated avionics system.

For example, this applies when the simulation needs to incorporate a diversity of data streams coming from a radio altimeter and/or a sensor (e.g. a temperature sensor), and/or a gyroscope (also called a "gyro").

In other words, it is difficult or even impossible in practice at the present time to obtain an abstraction, i.e. a "translation" or conversion, of these varied data streams in a manner that is simple.

For example, data in radians in engineering format needing to be translated into avionics protocol gives a voltage value that complies strictly with formally specified conversion tables.

As a result, it is particularly difficult with present-day simulations to represent faithfully the real architecture of an avionics system and/or to enable the system to be represented in part only.

Another problem that is presently encountered when simulating an avionics system is obtaining exhaustive and reliable definitions of the various components of the avionics system that it is desired to simulate. It is sometimes said that such definitions that are actually representative of reality are "consistent".

This is true in particular for the interfaces between the components and/or their subassemblies (in particular the partitions of certain pieces of equipment). In other words, it is at present difficult to obtain definitions that are consistent and exhaustive of the avionics architecture of a system that is to be simulated.

Another problem is that it is presently difficult or even impossible in practice to play back on a mock-up data that is sufficiently reliable and easy to process for the purpose of qualifying (specifying) at least one of the pieces of equipment of the avionics system.

In particular, such qualification data must in itself constitute an acceptable basis that is recognized by competent authorities for type approval (like the incremental qualification known in the field of quality control).

Still another problem is to have a simulation environment that is flexible and reliable in order to monitor all of the simulation data (regardless of whether it is in engineering and/or avionics format).

Consequently, it would be useful to enable the behavior of the components of the avionics system and their interactions to be analyzed in a context representative of real operational conditions.

For example, a flexible simulation would make it possible to take account of operational tolerance ranges and/or to define and/or to evaluate acceptable operating margins for one or more components of the avionics system.

One of the additional problems presently encountered with test benches is that, in practice, it is difficult to perform tests of an avionics system if any of its essential components are unavailable and/or not operational.

As mentioned above, it is desirable to have a simulation available that is "mixed".

This makes it possible to incorporate in the simulation, as and when they become available, validations from various actors involved in producing an aircraft (in particular people in charge of functions and/or avionics architects and/or in charge of flight testing and/or state services).

Thus, for each identified change in the avionics to be simulated, it should be possible to obtain perfect traceability and conformity of the corresponding simulation.

Furthermore, it is appropriate for the simulation to adapt to maintainability targets (in other words long life) that are imposed on avionics systems.

To this end, it is appropriate for the simulation to be capable of being generated at will so as to take account of each required change in the avionics system.

For example, the simulation platform must support the various generations of tools for generating avionics systems and/or must be compatible with the tools that are used in generating associated assemblies (functionally connected in order to make the aircraft operational). This applies particularly to the software environment.

SUMMARY OF THE INVENTION

Against this background, it would also be useful for all of the actors involved in the simulation or needing it, to be able simultaneously to exchange information that is useful for the simulation between one another, and even to act on that information, in a manner that is simple, fluid, and efficient.

For simulations, it is common practice for the mechanical components to be reproduced from a geometrical point of view by using a mock-up. For example, a mock-up may be used for physically simulating the arrangement of the controls in an aircraft cockpit.

In present-day avionics terms, a "mock-up" is a full-size prototype usable under conditions that are relatively representative of the conditions that apply to real mechanical components of the aircraft.

One of the uses to which the invention can be put is also referred to as a "mock-up" of an avionics system.

Such a mock-up is implemented on a real time simulation platform. It implements a method of the invention.

In the present application, the invention is also implemented in the form of a method, a platform, a system, and an aircraft.

Each of these forms or implementations presents its own specific and uniform features. Nevertheless, in practice, the method and the platform, and likewise the avionics system and the aircraft all present points in common.

That said, various specific features of the invention are mentioned below.

Firstly, it should be observed that the invention lies at the junction between a test bench using real components and a study simulator making use solely of digital models.

The invention enables functions to be performed that are comparable to those of a simulator and a test bench while enabling configurations to be reconfigured by adjusting real pieces of equipment and/or models thereof that are purely digital and that need to be simulated.

The invention enables both digital models and real sources to be mixed together. A simulation of the invention is then said to be "mixed". For this purpose, the platform in one embodiment needs only one computer, only one bus, and only one shared memory together with "machine" resources, i.e. processing resources.

In a mock-up of the invention, electrical exchanges relating to analog and/or discrete signals are simulated. For the digital models, their level of representativity is such that they can be mixed via an interface card with real pieces of equipment. Several pieces of equipment and/or components (including partitions) may be simulated.

This is different from that which is made available by presently-known simulators that do not enable the communications buses in the architecture of an avionics system to be modeled in a manner that is reliable and traceable.

An example of a simulation of the invention has been developed for a Linux® operating system installed on a commercially available personal computer (PC), e.g. a laptop computer.

It can be understood that such a computer differs from a dedicated workstation and does not necessarily have processing capacity and a number of processors in exceeding the capacity and the number of processors of the avionics system to be simulated.

By way of example, such a computer arranged for a simulation in accordance with the invention of 30 to 250 components (whether pieces of equipment and/or partitions, or the like) may have fewer than ten processor units (or CPUs, e.g. of the Intel® 32-bit Double Dual Core type) and may operate at a clock frequency lying in the range 2 gigahertz (GHz) to 3 GHz, while providing results that are entirely satisfactory.

In embodiments putting a high demand on resources, in particular concerning the clock that drives the simulation, it is possible to use platforms that guarantee so called "hard real time".

This applies for example to an iHawk platform and its RedHAWK software environment from Concurrent Computer Corporation.

Amongst the possible uses of the invention, mention is made in particular of designing, developing, verifying, validating and searching for causes of malfunction, and specifying on-board software and real pieces of equipment of avionics systems, and also their interfaces and communications architectures.

One of the objects of the invention is thus to enable all or part of an avionics system to be designed, developed, and exhaustively validated by real time simulation, possibly before it exists physically.

Such a simulation should make it possible not only to cover the study and functional validation of the avionics system, but also its architecture.

Another object of the invention is to develop and make available means suitable for using simulations to validate:

avionics architecture, i.e. the specifications of interfaces between the pieces of equipment that will be on board an aircraft; and/or specifications for interfaces that are internal to certain pieces of such equipment; and/or the functional specifications of software included in such equipment.

Thus, after being validated on the mock-up that forms a testing tool, the avionics system as tested virtually in this way must be capable of operating in a manner that is identical to the way it operates in real flight, thereby minimizing the problems or defects usually encountered during first flights or after each modification to a definition that has previously been tested on a conventional simulator.

Developing and testing avionics systems is becoming more and more complex.

This is because of the large volume of data to be processed. It gives rise to development delays and costs that are becoming greater and greater.

Furthermore, the complexity of pieces of equipment is becoming ever greater. This applies for certain pieces of equipment that are capable of implementing a plurality of functions (e.g. in compliance with the ARINC653 protocol).

In similar manner, the development of communications protocols (e.g. discrete, analog signal, ARINC429, RS422, and Ethernet) for use between pieces of equipment of an avionics system that is to be simulated requires major updating to be performed on conventional simulation tools.

As mentioned above, present simulation and test tools do not enable complete test coverage to be obtained of specifications for an avionics system.

Those tools do not reproduce effectively the lowest levels of behavior in interfaces and data exchange between real pieces of equipment and their subassemblies.

Furthermore, certain pieces of equipment cannot be fully tested by present simulation and test tools of the test bench type for use with real pieces of equipment. For example, an inertial unit possesses certain modes of operation that it is difficult to validate on a test bench with real pieces of equipment.

Thus, by way of example, present simulation and test tools concerning specifications are restricted to functional tests of equipment. Consequently, these specification simulation and testing tools do not make it possible to represent and test real protocols and/or exchange formats of the kind that are physically implemented on an aircraft.

To summarize, the invention seeks to make it possible to model or represent complex avionics systems, possibly in part only and/or hybrid systems, in order to perform simulations while achieving previously unknown levels of reliability, traceability, and maintainability.

To this end, the invention provides a mixed real time method of simulating an avionics system for an aircraft.

Said avionics system is designed to possess at least two pieces of equipment. At least one of these pieces of equipment has at least two partitions, an avionics operating system (OS) installed on a computer, and three communications interfaces including a communications interface for exchanges between said partitions, another communications interface with the operating system (OS) of the equipment, and a communications interface with communications drivers between said equipment and the avionics system.

According to the invention, an operating system of the real time simulation is different from at least an avionics operating system (OS) installed on a computer of a piece of equipment.

In order to have complete and consistent definitions of said interfaces available during the simulation, the method performs at least the following steps:

a step of translating communications interfaces as and when they are supplied and whenever they are varied: on the basis of formal files in a mark-up language using raw data in avionics format relating to the avionics system; the translation step encoding the physical behavior of said communications interfaces of said equipment hardware component(s) in the form of models in high level language; and a step of dynamically managing descriptions that seeks to group together, update, and share a database incorporating, for each piece of equipment, the encoding in the form of high level language models of all of the signals that pass via the communications interfaces.

The method provides encoding of model data from the translation into an engineering data format and decoding of data in engineering format to raw data in avionics format.

In order to enable at least partial simulation of communications interfaces, the method provides for the step of translation to raw data in avionics format to be performed on the basis of formal files in generic tagging or computer mark-up language, said data in avionics format defining the real destination aircraft.

According to another characteristic, in order to enable a simulation to be performed of an interface of at least one component of said equipment hardware that processes information streams in the form of values for physical variables, the method provides for the translation step to encode the physical behavior of said hardware equipment concerning accesses to its interface, in the form of a model in high level language.

According to yet another characteristic, in order to enable a simulation to be performed of at least one sensing device or component that produces data streams in the form of data in engineering format representative of an environment of the avionics system to be simulated, the method provides for the translation step to encode said engineering data from said sensing device in the form of a model in high level language representative of format parameters of said real sensor device.

In order to make it possible to simulate at least one trigger device or component that produces data streams in the form of engineering data for acting on the avionics system that is to be simulated, a characteristic of the method provides for the translation step to encode said engineering data of said trigger device in the form of a high level language model representative of format parameters of said real trigger device.

For example, hardware, sensing, and trigger equipment information streams are of the discrete and/or analog and/or digital type, and in particular are compatible with a protocol such as ARINC429, ARINC653, MIL-STD-1553B, RS422, Ethernet.

According to a characteristic of the method, the step of managing descriptions provides for dynamic shared storage in said database of models of the communications architecture between said models and/or within an up-to-date set of pieces of equipment of the avionics system to be simulated.

According to another characteristic of the method, the step of managing descriptions provides for generating interface requirement specifications (IRS) for sharing in said database.

According to yet another characteristic of the method, the step of managing descriptions provides for automatically generating data representative of the equipment interfaces in avionics format compatible with interpretation and real time access during the simulation.

According to the characteristic of the description management step, the invention provides for the shared database to feed the simulation during this step after automatic analysis of the interface descriptions performed during a pretreatment stage and producing source code files of the translation step, said step supplying in return services and functions that are representative of exchanges performed within the avionics system to be represented by the simulation.

In an implementation, the dynamic management step provides for grouping together interface signals in the database by transmission over a network, e.g. wired (LAN, ADSL, etc.) and/or wireless (Wi-Fi, WPAN, UFH, IEEE802.15.4, etc.), upstream from and/or during the simulation, in particular during a stage of real and/or virtual connection of a piece of equipment, or indeed during tests of the avionics system and/or tests of the destination aircraft.

The invention also provides a platform suitable for implementing the above method, said platform comprising a personal computer (PC) with a Linux® type operating system. The platform includes a peripheral for connecting real pieces of equipment and/or analog models and/or digital models for transmitting binary and/or discrete or analog data.

In an embodiment, the platform includes at least one physical memory volume for storing data translated to avionics format and encoded using a true bit sequence.

The invention also provides an avionics system for a destination aircraft. The avionics system has been the subject of at least one simulation in accordance with the above-mentioned method.

The avionics system possesses at least two pieces of equipment. At least one of these pieces of equipment includes at least two partitions, an avionics operating system (OS) installed on a computer, and three communications interfaces, including an interface for exchanges between said partitions, another interface for communication with the operating system (OS) of the equipment, and an interface for communicating with communications drivers between said equipment and the avionics system.

At least one of the pieces of equipment is compatible with one of the following protocols: ARINC429, ARINC653, MIL-STD-1553B, RS422, Ethernet.

Finally, the invention provides an aircraft. The aircraft includes at least one avionics system that has been the subject of at least one simulation in accordance with the above-mentioned method.

In an embodiment, the aircraft of the invention is a rotary wing aircraft, such as a helicopter or a hybrid helicopter.

In another embodiment, the aircraft of the invention is an airplane, or a drone.

BRIEF DESCRIPTION OF THE DRAWINGS

The invention and its advantages appear in greater detail from the following description of embodiments given by way of illustration and with reference to the accompanying figures, in which:

FIG. 3 is a diagrammatic longitudinal elevation view of a rotary wing aircraft of the invention, of the conventional helicopter type having a manned cockpit and provided with at least one avionics system in accordance with the invention;

FIG. 4 is a diagrammatic perspective view in longitudinal elevation from above and in front of an aircraft in accordance with the invention, of the hybrid helicopter type, in the form of a drone, with a remote controller;

FIG. 5 is a diagrammatic perspective view in longitudinal elevation from above and in front of an aircraft of the invention of the airplane type, having a manned cockpit and in accordance with the invention;

FIG. 6 is a diagrammatic view of an architect's view display in accordance with the invention after a simulation in accordance with the invention;

DETAILED DESCRIPTION OF THE PREFERRED EMBODIMENT

Embodiments and implementations of the invention are described below.

Figure 1:
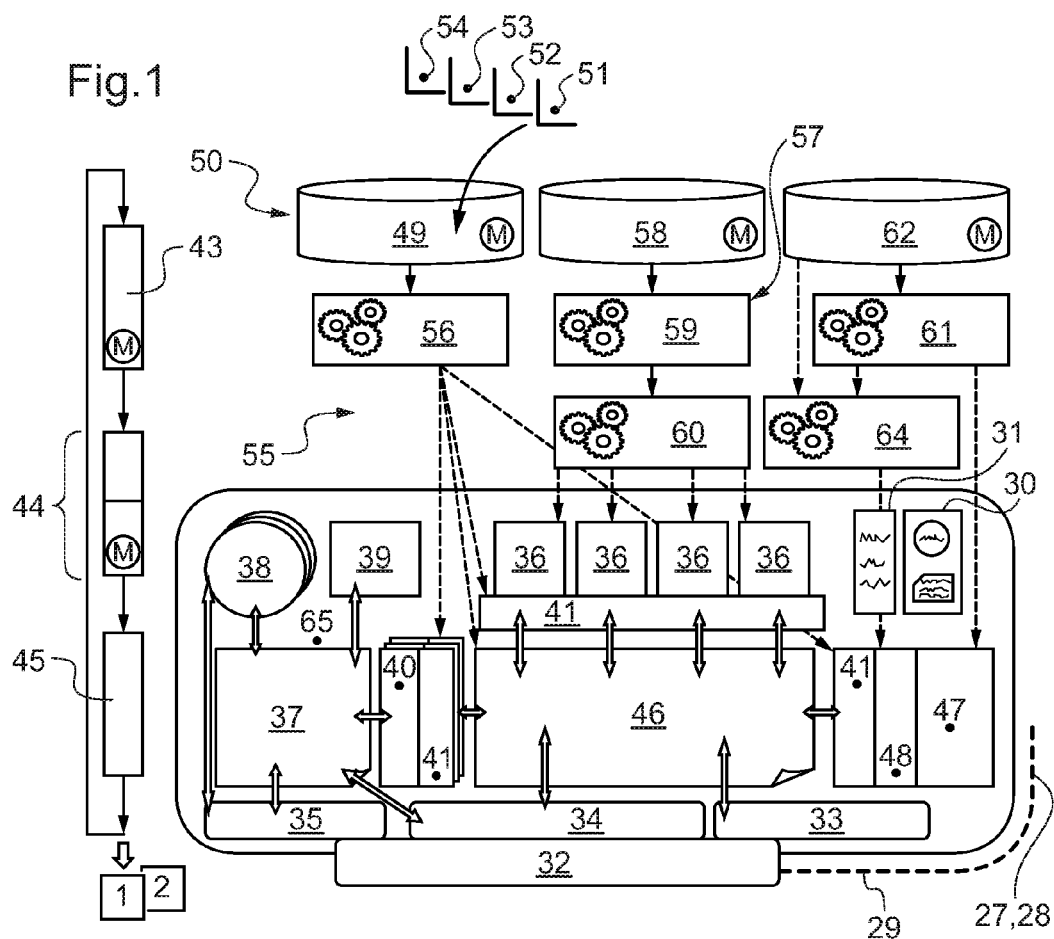
FIG. 1 is a diagram of the invention showing the sequence and the context in terms of method, automatic and/or manual steps, stages, and components of the installation; steps/stages marked with an "M" in a ring are manual, at least in part, while the others are automatic.
Figure 2:
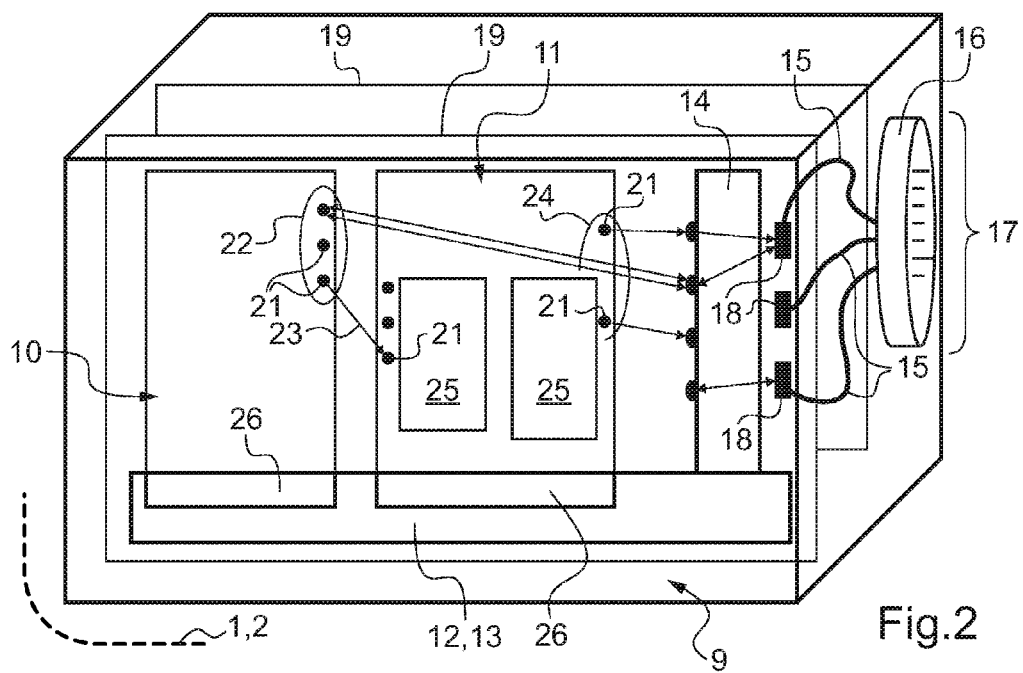
FIG. 2 is a diagrammatic view of an example of complex equipment of the invention, having a plurality of partitions.

After FIGS. 1 and 2 (summarized above), in FIGS. 3 to 5 in particular, reference 1 is an overall reference to an aircraft. The aircraft 1 includes at least one avionics system 2 that has been subjected to simulation in accordance with the invention, as described below.

FIGS. 3 to 5 also show three mutually orthogonal directions X, Y, and Z. In aviation, the direction X generally corresponds to the roll axis of the aircraft 1.

Another direction Y is a transverse direction and corresponds to the widths or lateral dimensions of the structures described. The longitudinal direction X and the transverse direction Y are sometimes said to be horizontal, for simplification purposes.

A third direction Z referred to as the elevation direction corresponds to the height dimensions of the structures described. Sometimes the elevation direction Z is said to be vertical.

In FIG. 3, the aircraft 1 of the invention is a rotary wing aircraft. In this example, the rotary wing aircraft 1 is a modern helicopter, having a main rotor 3 and an antitorque tail rotor 4.

In FIG. 4, the aircraft 1 is a hybrid helicopter. An aircraft 1 of the hybrid helicopter type is an advanced concept for an aircraft that takes off and lands vertically, and embodiments thereof are described for example in documents FR 2 916 418, FR 2 916 419, and FR 2 916 420.

In FIG. 4, the aircraft 1 possesses a main rotor 3 and two lateral rotors 4, each arranged on a fixed wing 5, and serving to perform both antitorque and propulsion functions.

Furthermore, it may be observed in FIG. 4 that the example hybrid helicopter is in the form of a drone. This aircraft drone 1 possesses a controller 6 that is remote, i.e. it is not on board the aircraft.

The remote controller 6 is arranged so as to be suitable for being operated by a pilot (not shown) using radio control, and it has a flight control device 7 that acts remotely on the orientation of the hybrid helicopter drone in terms of pitch and/or roll. The controller 6 also has a member 8 for controlling the thrust delivered by the lateral rotors 4.

It should also be observed that an avionics system 2 that is not on board the drone is arranged within the remote controller 6 of FIG. 4. In this example, the avionics system 2 possesses at least one piece of equipment 9, i.e. a complex component of the system 2.

The same applies in FIGS. 3 and 5 except that in these figures the pieces of equipment 9 of the avionics system 2 of these aircraft 1 are located on board.

However, in FIGS. 3 and 5, the cockpit 6 is on board. In FIG. 5, the aircraft 1 of the invention is an airplane. Embodiments of the invention that are not shown provide for the aircraft 1 to be a conventional helicopter drone or an airplane drone, in each case provided with a remote controller 6.

In the field of the invention, and more generally for all of the aircraft 1, the term "avionics system" 2 designates a unit that enables a series of functions to be performed in the context of specifications and on the basis of data.

By way of example, the avionics system 2 to which the invention applies may be: an autopilot (A/P); navigation aides; training simulators (see FIG. 8); and also various on-board systems 2, e.g. relating to the delivery of fuel or the supply of hydraulic power on board the aircraft 1.

Amongst such units, there are those that are of the completely hardware type such as component parts and physical components, and those that are of non-material type such as software and specifications.

Such parts and components are sometimes both, in the sense that they include both physical members and logic coding or data tables.

In certain avionics systems 2 to which the invention applies, the components are on board as in FIG. 3. However in other avionics systems 2 to which the invention applies the components are not on board, as in FIG. 4.

Referring back to FIG. 2, it can be seen that within an aircraft 1 there is arranged an avionics system (represented symbolically in dashed lines down and to the left), which system comprises in particular a piece of on-board equipment 9 that complies with the ARINC653 protocol. Conventionally, an avionics system 2 comprises a plurality of on-board pieces of equipment of a variety of sites.

In short, the ARINC653 protocol is a standard for time and space partitioning of avionics computer resources.

The ARINC653 protocol also defines programming and configuration interfaces that make it possible to ensure that an application is independent from the underlying software and hardware. A partitioning principle enables avionics functions of different levels to co-exist on a common platform, thus enabling these functions to be qualified by an incremental process, and also enabling a process to segregate function suppliers.

The ARINC653 protocol also defines an application programming interface (API) to enable the avionics application software adopted to be portable, in particular by using integrated modular avionics architectures (IMA).

In FIG. 2, the avionics system 2 is in the form of a complex piece of equipment 9 of the invention.

The piece of equipment 9 comprises a plurality of partitions 10 and 11, and an avionics operating system (OS) 12 installed on a computer 13.

Drivers 14 are connected by a wire connection 15 such as a ribbon cable to a connector 16 that acts as a communications interface 17 between the equipment 9 and the outside, in particular the remaining equipment 9 of the avionics system 2.

It should be observed that this equipment 9 actually possesses three types of communications interfaces, including the communications interfaces 17 with the outside. This communications interface 17 with the outside is used for dialog with exchange formats other than the ARINC653 protocol, and in particular: ARINC429; and/or discrete input/output signals; and/or analog input/output signals; and/or Ethernet; and/or LVDT; etc. signals.

It should be observed that between each connection and the drivers 14 there is a specialized microelectronic circuit 18 known as an application specific integrated circuit (ASIC). Each circuit 18 performs the operation of an APEX type external port. It can also be seen in FIG. 2 that the equipment 9 possesses a plurality of modules 19.

On the partition 10, internal ports 21, likewise of the APEX type, form part of a communications interface 22 between said partition 10 and another partition 11 via channels 23.

Similarly, on the partition 11, internal ports 21, likewise of the APEX type, form part of another communications interface 24 between this partition 11 and the drivers 14.

The communications interfaces 22 and 24 essentially convey raw data in avionics format. It can be seen that within the partition 11 there are installed two procedures 25. These procedures 25 handle data in engineering format.

Thus, the three communications interfaces are an interface 22 for data exchanges between said partitions 10 and 11, another interface 26 for enabling the partitions 10 and 11 to communicate with the avionics OS 12 of the equipment 9, and the communications interface 24 communicating with the communications drivers 14 leading to the remainder of the avionics system 2.

As mentioned above, the invention serves to simulate an avionics system 2 of the aircraft 1. In the simulation example shown in FIG. 1, the invention is developed to operate on a commercially available personal computer (PC) shown diagrammatically at 27, e.g. a laptop computer. The computer 27 has an operating system 28 of the Linux® type installed, which is naturally distinct from the avionics OS 12 of FIG. 2.

It can be understood that such a computer 27 differs from a dedicated workstation, and that in this example it is not provided with processing capacities and some number of processors greater than the processing capacities and number of processors of the avionics system 2 that is to be simulated.

The computer 27 is designed to simulate 30 to 250 components and it has four central processor units (CPUs), specifically of the Intel® 32-bit Double Dual Core type. The clock frequency of the computer 27 is 2.4 GHz.

The computer 27 and its operating system 28 form part of a platform 29 that is suitable for implementing the invention.

The platform 29 of FIG. 1 includes a peripheral 30 for connecting real components and/or pieces of equipment 9, and also a peripheral 31 for connecting analog and/or digital models, and for transmitting binary and/or discrete or analog data.

It can also be seen that the platform 29, and more specifically its computer 27, is provided with at least one display peripheral or console 32. This peripheral 32 in the example of FIG. 1 is a display screen. The peripheral 32 is connected to an interface arrangement 33 for displaying information relating to the ARINC429 protocol, a display arrangement 34 for displaying architecture information, and an arrangement 35 for controlling simulation models.

In this embodiment, the platform 29 also has a plurality of physical memory volumes 36 for recording data translated into avionics format. These physical volumes 36 are coupled to input/output functions referenced 41.

Another memory volume 37 includes a shared memory environment having data recorded therein in engineering format.

This data comes from and/or goes to physical behavior models 38, virtual control panels 39, and models of sensing devices or components, typically referred to as sensors. These models 40 of sensing devices are coupled to input/output functions likewise referenced 41.

This makes it possible to implement a so-called "translation" step of a method of the invention.

In order to be able to simulate at least one component forming a sensor device that produces a stream of information in the form of data in engineering format representative of an environment of the avionics system 2 being simulated, provision is made for this translation step to encode said engineering data from said sensor device in the form of a high-level language model, the data being representative of parameters in the format of the real sensor equipment.

Similarly, in order to be able to simulate at least one component forming a trigger device, e.g. a control or a servo-control that produces a stream of information in the form of engineering data for acting on the avionics system being simulated, the method provides for the translation step to encode said engineering data of said trigger device in the form of a high-level language model, the data being representative of parameters in the format of the real trigger device.

For example, the information streams of hardware, sensor, and trigger components are of the discrete and/or analog and/or digital type and are compatible in particular with a protocol such as ARINC429, ARINC653, MIL-STD-1553B, RS422, Ethernet.

That said, it can be understood that FIG. 1 sets out the sequence and the context of the invention in terms of a method, automatic and/or manual steps, installation components and stages, and relative to a life cycle of the destination aircraft 1.

This cycle provides periods 43, 44, and 45 respectively of specification, integration, and evaluation that include at least one simulation performed on the platform 29.

It should be observed in FIG. 1 that blocks marked with an "M" in a ring require at least some manual action in order to be executed. The others are automatic, with the exception of the block representative of the integration period 44 which is partially manual and partially automatic.

Reference 46 represents another memory volume for recording data in avionics format, and in particular interface requirement specifications (IRS).

According to a feature of the invention, a step of managing descriptions as described in greater detail below makes provision for integrating IRS documents for sharing a said database hosted within the memory volume 46.

Yet another memory volume 47 serves to store data in avionics format, in particular man-machine interface (MMI) models. Input/output structures of the partitions are coupled to the volume 47, said volume 47 being itself connected to the volume 46 via input/output functions also referenced 41.

Upstream from the platform 29, it can be seen that the simulation of the invention has recourse to dedicated databases that constitute resources.

One of these databases, referenced 49, is dedicated to interface specifications. These resources defining interface specifications are typically in the form of a "tagged extensible language".

One such language, known as extensible mark-up language (XML) is a generic tagging computer language that serves essentially to store/transfer Unicode type text data with fields in tree structures. The language is said to be extensible since it enables the user to define tags for elements. The user can manipulate tag name space and borrow definitions from other users.

The simulation in accordance with the invention makes provision that in order to enable at least partial simulation to be performed, the step of translating data into avionics format is performed using formal files in generic tagging computer language, said data in avionics format defining the real intended aircraft 1.

When generating the simulation as shown in FIG. 1, a first step 50 involves establishing the database 49 dedicated to these interface specifications. It can be seen that this step 50 is performed manually.

The step 50 implies analyzing interfaces, in particular in terms of data exchange consistency. This leads to creating an exhaustive set of files in XML, listing all of the exchanges within the avionics system 2, and all of the functions needed for managing these exchanges.

Two main XML files need to be provided:
a file 51 describing all of the outputs generated by each type of equipment 9, and indicating the way in which the data is formatted; the file 51 also groups together all of the data defining correspondences between physical data and electrical data; and
a file 52 that describes all of the signals issued by a given type of equipment, together with all of the occurrences of said pieces of equipment; for each signal all of the pieces of equipment and other components of the avionics system 2 being simulated that are capable of invoking the signal are incorporated in the file 52.

Concerning the equipment 9 complying with the ARINC653 protocol, it is appropriate also to provide two other files in the database 49, namely:
a file 53 describing all of the ports sent or received by each partition (e.g. 10, 11) of a piece of equipment 9 such as that shown in FIG. 2; and
a file 54 describing all of the channels (such as the channel 23) sent or received by each of the partitions (10, 11) of the piece of equipment 9.

At this stage, there is a second prior step referenced 55 in FIG. 1. This step 55 is mentioned above, and it is the real time translation step.

This translation step 55 is performed (block 56) progressively while the avionics system 2 is being provided and developed. These developments act progressively to provide and adjust all of the data in engineering format relating to the avionics system 2, which data is then translated in abstract form into data in avionics format.

During the translation step 55, which is automatic, file headers and libraries are also translated and components are generated in the form of C/C++ structures representative of the necessary definitions.

The block 56 is a "partitioning" simulation distributor that performs the investigation using the following code:
CREATE_SAMPLING_PORT,
READ_SAMPLING_MESSAGE,
WRITE_SAMPLING_PORT . . .

For encoding and decoding, and vice versa, automatic translation step 55 generates functions in application of the following code:
Analog_set_value, analog_get_value,
discrete_set_value, discrete_get_value,
a429_set_value, a429_get_label
a429_set_sdi, a429_get_sdi,
a429_set_ssm, a429_get_ssm . . .

To finish off the automatic translation step 55 and the functions, the following code is executed:
Lxxx_yy_get_zzzz and Lxxx_yy_set_zzz
where:
xxx represents label number;
yy represents SDI; and
zzzz represents encoded field.

During preprocessing of the simulation of the invention, and following step 55, there is a sub-system translation step performed at step 57 shown in FIG. 1.

A database 58 is fed manually by contributions coming from a tool dedicated to autopilot functions, the data being in the form of specifications. A generator 59 is fed with these specifications coming from the database 58, the generator 59 being automatic. Then, step 57 is properly speaking executed by an autopilot or "A/P" dedicated automatic translator 60.

The specifications of the database 58 are then automatically translated to a real time interactive simulation environment format such as those typically used in testing tools and/or rich media piloting training networks.

After step 57 of translating sub-systems of autopilot functions, it is possible for the real time interactive simulation environment format (data in avionics format) to be invoked by the simulation of the invention, as performed by the platform 29.

Still during preprocessing of the simulation of the invention, step 55 is followed by sub-system translations performed in step 61 shown in FIG. 1.

For this purpose, a database 62 is fed manually with contributions coming from a tool dedicated to man-machine interfaces, likewise in the form of specifications. A generator is fed with these specifications coming from the database 62, the generator being automatic. Then, step 61 is properly speaking executed by a dedicated automatic MMI translator 64.

The specifications of the database 62 are then automatically converted/translated.

After step 61 of translating sub-systems of the man-machine interface, it is possible for data in avionics format to be invoked by the simulation of the invention, performed by the platform 29.

Finally, FIG. 1 shows an automatic updating step 65 whenever a new simulation is integrated after a new version of interfaces of the equipment 9 or of the software therein has been delivered.

There follows a description of other functions of the invention based on an example of an avionics system possessing (at least) one hydraulic component of temperature that is monitored during the operation (to be simulated) of the aircraft 1.

FIG. 6 shows that the platform 29, and more specifically its display peripheral 32, displays a graphic display 66 in the form of an architect's view.

The display 66 shows an example of symbology applied to a piloting interface relating to an on-board hydraulic function.

The display 66 is interactive and enables four modes to be selected.

There is a mode of displaying physical values selected by pointing on a virtual button 67. By pointing on the virtual button 68, an electrical value display mode is selected.

A mode of displaying physical value defaults is selected by pointing on a virtual button 69. By pointing on a virtual button 70, a mode is selected for displaying electrical value defaults.

In FIG. 6, there can be seen two computers 71 on the left and 72 on the right. Each of these computers 71 and 72 possesses a channel A and a channel B, and each is connected so as to enable cross-talk exchanges.

These computers 71 and 72 operate in parallel, such that one of them (71) is in charge of normal acquisitions 75 and symbology productions (VMS) 73 for the pilot and the copilot. This symbology 73 relates in particular to hydraulic temperature.

The other computer 72, in parallel, receives a cyclic functional stream 74 during execution for consolidating data coming from a redundancy simulation 77.

For these purposes, the computers 71 and 72 are connected to temperature sensors 76, one for the normal acquisition 75 and the other for the cyclic stream 74.

An electrical power control 78 connected to the computer 71 has a ground connection 79 and channels 80, 81, and 82 for automatic operation, stopping, and testing.

This should be compared with a dynamic management step that sets out to group together, update, and share a database that incorporates for each piece of equipment all of the signals relating to the communications interfaces in the form of data in avionics format.

Figure 7:
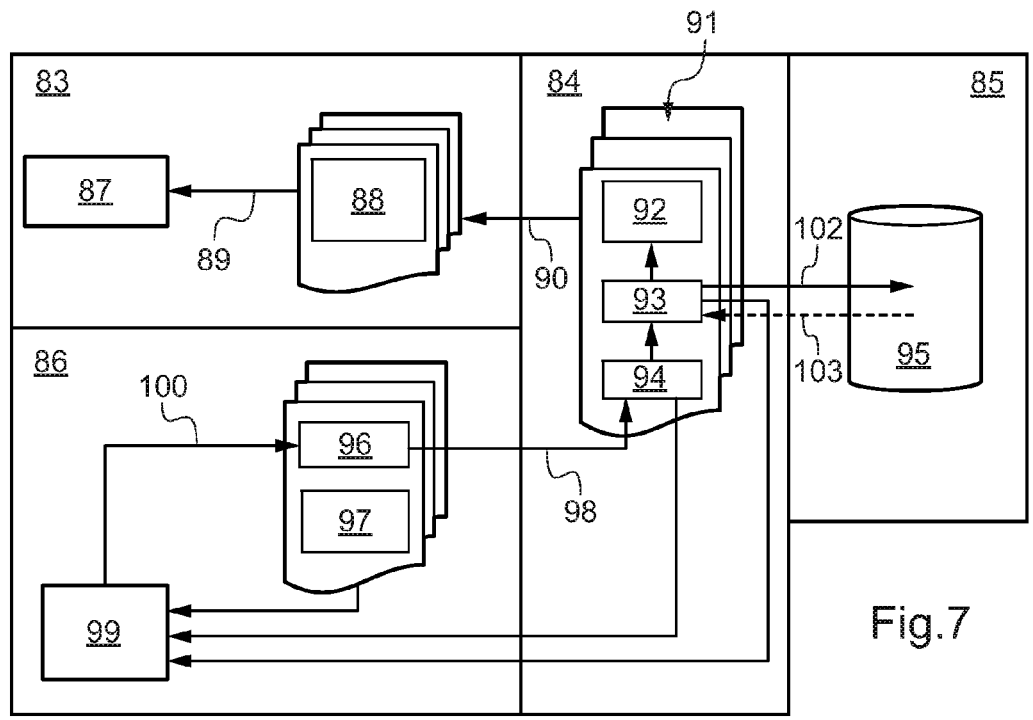
FIG. 7 is a block diagram showing an overall view of procedures for developing avionics systems in accordance with the invention.

With reference to FIG. 7 there can be seen a block diagram giving an overall view of the procedures for developing avionics systems 2 in accordance with the invention.

There can be seen work spaces 83 to 86. The work space 83 is local and dedicated to the actors involved in the simulation.

This makes it possible to incorporate in the simulation, as and when they become available, validations from these actors involved in the production of the aircraft 1.

Such actors, represented at 87, are constituted in particular by people in charge of functions and/or avionics architectures and/or test pilots and/or state services.

An interface database 88, comparable to the database 58, contains data in engineering format specific to the environment (real time interactive simulation) used in: test tools and/or media-rich piloting training networks. Reference 89 designates a validation impact.

Reference 90 designates a request made to an actor for updating information and distribution. It connects space 83 to space 84 where there can be seen another interface database 91 for referencing interface communications.

For a reference 92, the interface database 91 updates at 93 and collects data in particular in avionics format. This database 91 also proceeds with evaluations 94 of update requests, e.g. issued by the work space 86.

In the space 86, there can be seen a modified reference interface 96 from the database 91 that applies to a highly representative simulation interface 97 after official confirmation 98 of an update request.

From the evaluations 94, modification requests that have been rejected 98 are transmitted to a user 99 of the highly representative simulation. The user 99 produces and transmits requirements 100 for modifications and evaluation sent to the modified referencing interface 96.

Local validations pass from the location of the highly representative simulation interface 97 to the user 99.

In the work space 85, there can be seen a translation 102 and extraction 103 database 95 together with a highly representative simulation procedure.

Figure 8:
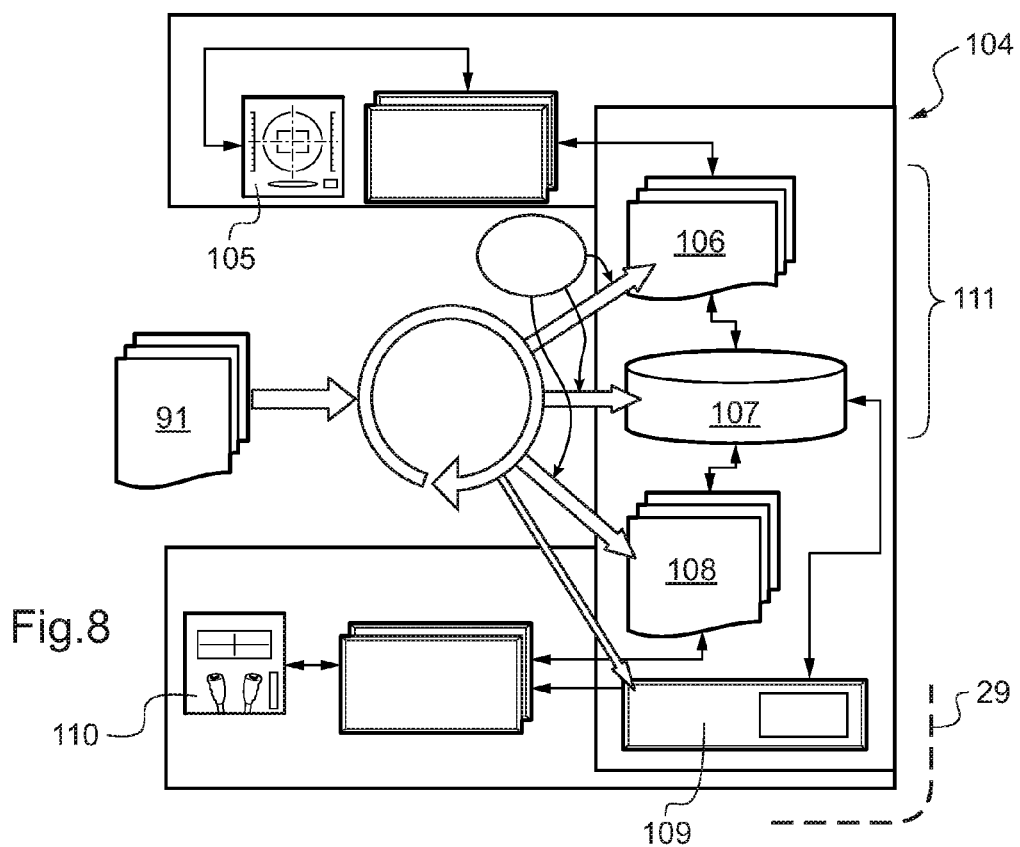
FIG. 8 is another block diagram showing a highly representative simulation procedure in accordance with the invention in its close context.

FIG. 8 is a block diagram showing a highly representative simulation procedure in its close context.

Preprocessing steps and/or stages 104 are performed on a lightweight platform 29 (PC) provided with a display 105 for viewing simulated flight aides.

The platform 29 controls simulation input/output steps and/or stages with simulated models 106 of complex equipment communications layers, a shared interface memory 107 translated into avionics data format, encoding/decoding services 108. Display services 109 are also provided that interact with a simulation control station 110.

After the preprocessing, the platform 29 establishes links to dynamic libraries in a dynamic management step referenced 111.

Figure 9:
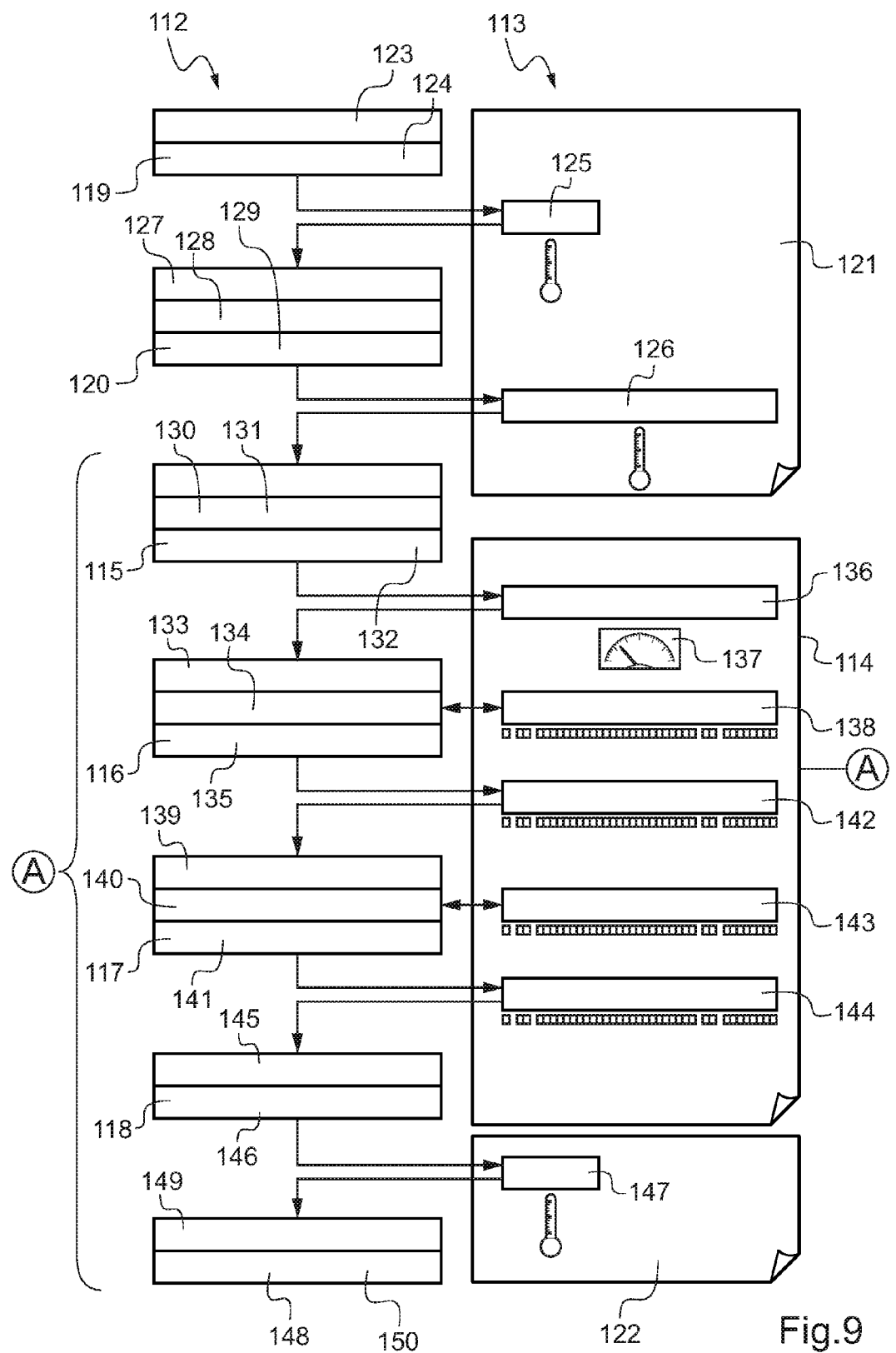
FIG. 9 is a block diagram showing the procedure of processing data in accordance with the invention including stages marked with an "A" in a ring that are automated at least in part, the other stages being manual; with this figure being for comparison with FIG. 6.

FIG. 9 is a block diagram showing the way in which data processing in accordance with the invention proceeds.

The diagram comes into the context of an example of monitoring hydraulic temperature in an avionics system.

Steps/stages in the left-hand column 112 are performed within models, while the steps/stages within the right-hand column 113 are performed within shared memories.

Blocks of steps/stages 114 to 118 that are marked with an "A" in a ring are automated, at least in part. Other blocks 119 to 121 are executed manually. The same applies to the block 122.

Because of the function of measuring a hydraulic temperature to which it relates, FIG. 9 should be compared with FIG. 6. The block 119 relating to the environment provides for a processing stage 123 and a writing stage 124.

The block 121 contains a first portion of the data in the engineering format of the shared memory. Temperatures are recorded therein at 125 and at 126.

In the block 120 relating to hydraulics, there are provided three stages, respectively a reading stage 127, a processing stage 128, and a writing stage 129. These stages lead to the temperature 126 of the block 121.

In the partially-automated block 115, relating to a sensor device in the form of a temperature sensor, there are provided manual stages 130 of reading the temperature 126, and automatic stages 131 of determining "analog_set_value" (see above) and 132 of writing "write_message". The stage 132 feeds a source 136.

The automatic block 116 contains stages 133-135 suitable for a computer comparable to that referenced 72 in FIG. 6. An automatic stage 133 is performed thereon of reading the message (coming from the block 114, in particular the source 136 of data in avionics format, with a voltage value being displayed on a dial 137). Conventionally, these stages 133-135 execute respectively message reading, processing, and message writing.

The message writing 135 leads to the block 114 so as to feed the cross-talk block 138. The data format of this block is avionics format.

The automatic block 117 contains stages 139-141 suitable for a computer comparable to that referenced 71 in FIG. 6.

An automatic stage 139 is performed thereon of reading the message from the block 114, and in particular a source 142 of data in avionics format. Conventionally, these stages 139-141 respectively execute message reading, processing, and message writing.

This message writing 141 leads to the block 114 to feed a cross-talk block 143. The data in the block 143 is in avionics format. Still in block 114, there can be seen a symbology block 144 in which the data is in avionics format.

The models block 118 relates to the inputs/outputs of a multifunction display (MFD). It includes a stage 145 of reading the message from the block 144. It also includes a stage 146 of establishing a label.

The block 122 of shared data contains a second portion of the data in engineering format in shared memory. A temperature parameter is stored therein at 147

This parameter is transmitted to the block 148, and more specifically during its stage 149. This block 148 relates to a multifunction display (MFD). It includes a stage 149 of reading data from the block 147. It also includes a display stage 150.

Figure 10:
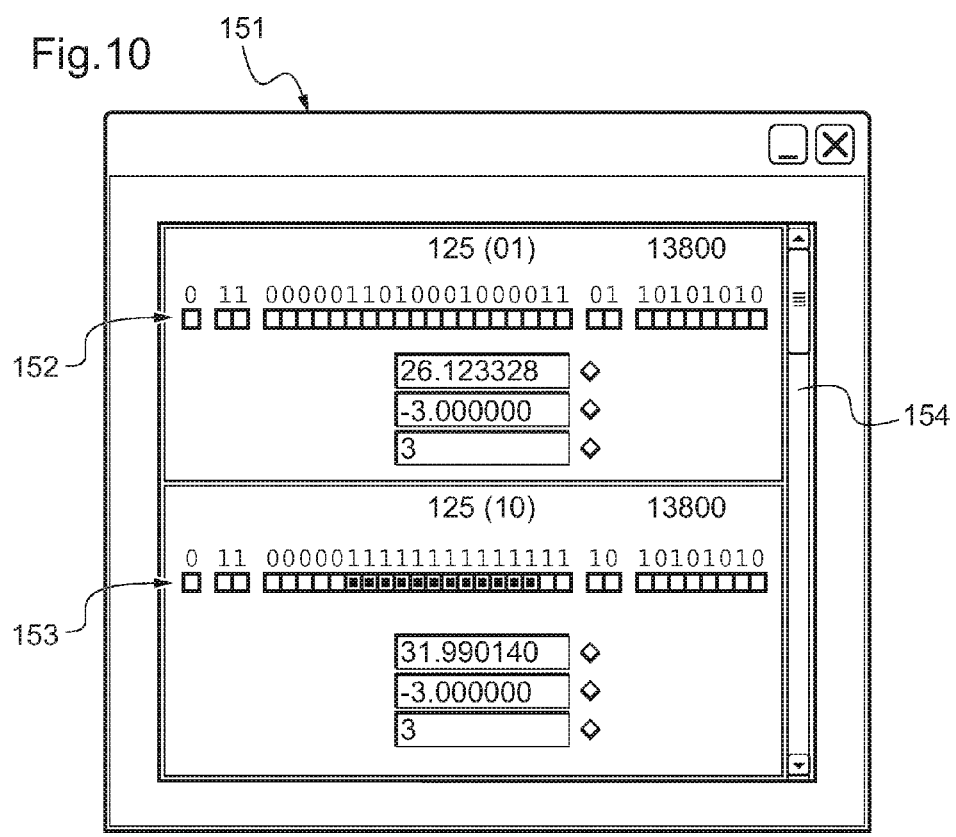
FIG. 10 shows a visual display illustrating an example of a label activator in accordance with the invention within a hydraulic avionics system, and is thus for comparison with FIGS. 6 and 9.

FIG. 10 shows a display illustrating an example of a label activator 151 suitable for directly modifying the content of labels 152 and 153 by bit-wise action, in accordance with the invention.

The activator 151 has a pull-down menu 154 for displaying data in avionics format in binary, in which each bit can be modified independently of the others.

This figure, which also applies to ARINC429 type equipment, relates to a hydraulic temperature (of value that is adjusted relative to a nominal value) within an avionics system 2, and should thus be compared with FIGS. 6 and 9.

Figure 11:
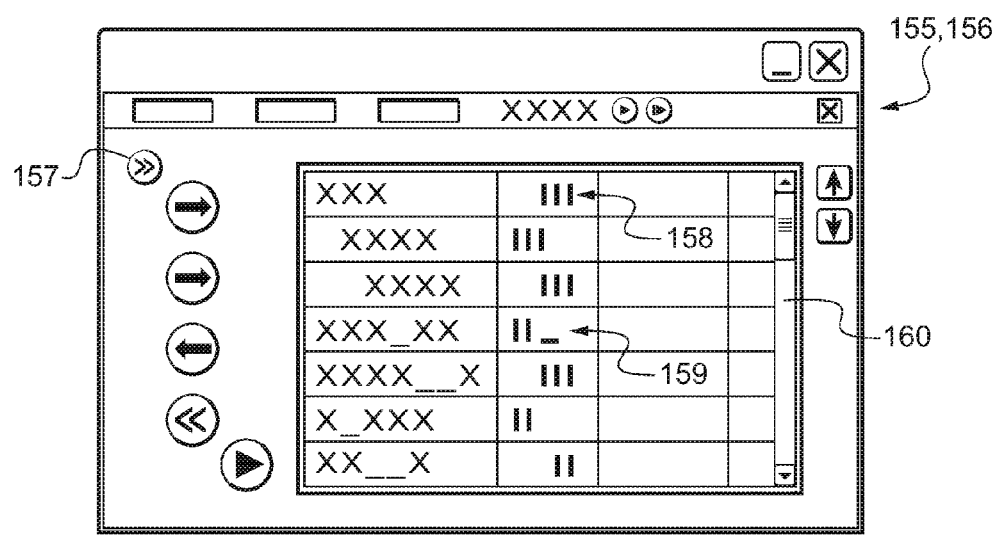
FIG. 11 shows a visual display that illustrates an example of an investigation dumping window that applies to hydraulic equipment in accordance with the invention, and that is for comparison with FIGS. 6, 9, and 10.

FIG. 11 shows a visual display 155 showing an example of a dumping and investigation window 156.

This window presents selection performed by a pointer 157 for pointing to physical data 158 of the hydraulic model in engineering format. A selection 159 corresponding to internal electrical data in avionics format gives a real time representation as a function of the fields having been selected from the pull-down list 160.

FIG. 11 applies to hydraulic equipment and should likewise be compared with FIGS. 6, 9, and 10.

At this stage, it can be stated for the invention that in method terms in order to have available during a simulation definitions that are complete and consistent for the various interfaces, at least the following are performed:

a real time translation step as and when data is provided and varies concerning all of the data in engineering format relating to the avionics system 2, the data being translated into avionics format; and a dynamic management step that groups together, updates, and shares a database that for each piece of equipment 9 incorporates all of the signals relating to the communications interfaces (10, 11) in the form of data in avionics format.

As mentioned above, in order to enable at least partial simulation to be performed, the method provides for the step of translating data into engineering format to be performed on the basis of formal files in a generic tagging computer language (XML) and of raw data in avionics format defining the real destination aircraft 1.

In order to make it possible to simulate an interface of at least one hardware component, i.e. a component that handles information streams in the form of varying physical values, the method provides for the translation step to encode the physical behavior of the interface of said hardware component in the form of a model in high level language.

The main drawbacks of previously known techniques should be recalled. It is known that developing and testing avionics systems 2 is becoming more and more complex as a result of the large volume of data to be processed for this purpose.

This gives rise to development delays and costs of ever increasing magnitude for new avionics systems 2 and also for improvements or adjustments to such systems.

In addition, in present avionics systems 2, certain pieces of equipment 9 serve to integrate a plurality of functions (such as for example those that comply with the ARINC653 protocol), thereby increasing complexity.

Meanwhile, changes in communications protocols (e.g. discrete, analog signals, ARINC429, RS422, and/or Ethernet) between pieces of equipment require updates that are quite fundamental, particularly in terms of software and simulation methods, and give rise to considerable extra costs.

Furthermore, as stated above, present mock-ups, and indeed complete test benches, do not enable the specifications of an avionics system 2 to be subjected to exhaustive test coverage.

Firstly, with conventional test benches, they do not test the lowest levels of interfaces and exchanges between real pieces of equipment or sub-assemblies thereof.

Secondly, with mock-ups that incorporate digitizing, they provide only limited test coverage.

In particular, mock-ups such as those corresponding substantially to the teaching of document U.S. Pat. No. 5,541,863 are capable in practice of performing a simulation only on condition that all of the pieces of equipment 9 (often real, but possibly also modeled) are actually connected to the mock-up and operational. As a result, if any of these pieces of equipment fails, then the simulation cannot proceed.

In addition, certain pieces of equipment cannot be tested completely on such a bench having real pieces of equipment.

For example, an inertial unit possesses modes of operation that are difficult to validate on a test bench using real equipment.

Thus, for example, present systems for test simulation on specifications are limited to functioning testing equipment without testing the real data exchange protocols and formats in the manner in which they will be implemented physically.

The invention has been developed to provide a novel tool capable of being used jointly with the various methods of type approval, specification, and development, for the purpose of reducing the time required for development and reducing technical risks.

It is further emphasized that the invention thus ensures levels of reliability, traceability, and maintainability that have not been achievable in the past.

For this purpose, the invention is used jointly with the specification and development process for the purpose of reducing development time and technical risk.

The invention makes it possible to validate a complete avionics system on specification or by introducing certain real pieces of equipment in the loop, based on a real time simulation environment.

All of the specifications of the avionics system are written using given formalism so as to be stored in a database.

By way of example, these specifications comprise:

the real and complete protocols for data exchange and communication between the various pieces of equipment, modules, or partitions for equipment complying with the ARINC653 standard;

the software source code for the various modules, partitions, or pieces of equipment in high level language, e.g. obtained as a result of generating code provided by dedicated tools making it possible to obtain simulated code that behaves identically to on-board code; and the specifications of each function or piece of equipment making it possible to simulate the on-board avionics so as to provide the same application programming interface (API) as will be available on the future on-board equipment.

All of the data exchanged between the pieces of equipment and within pieces of A653 equipment is represented in a shared "electrical data" memory.

An aircraft simulation tool serves to simulate the real physical behavior of the aircraft and of its on-board systems (hydraulic system, fuel system, engine, flight control, etc.).

All of this data is represented in a shared "physical data" memory.

Sensor models serve to simulate the physical behavior of its sensors by implementing communication between the "physical data" and the "electrical data".

A real time simulation tool makes it possible to simulate the real time behavior of the avionics system as defined in this way. This tool serves to incorporate in a real time simulation:

a model of the aircraft 1 and its engine and on-board systems;

sensor models;

interface specifications of the avionics system 2; and source code written in high level software language for the various portions of the on-board software.

The models that simulate the physical behavior of the helicopter and its systems generate all the variables required by the simulation. The physical variables are transformed into electrical values by the sensor models in order to be fed to the avionics system 2. The electrical values coming from the formal definition and the engineering data, while the formal definition is still not mature, may be mixed in the simulation, thereby enabling a step-by-step approach via the specification process.

The software of the avionics system provided by specialists is preferably developed using high level specification tools, e.g. for the autopilot and for the man-machine interfaces, so as to enable code to be generated automatically, thus making it possible to obtain behavior for the simulation model that complies strictly with the specifications.

All of the interfaces of the equipment and partitions (typically ARINC653) including detailed information such as the producer, the refresh rate, the coding of ARINC429 labels, analog electrical conversion tables, are formally described in XML files.

The entire set of interface files is managed by a dedicated tool that is considered as being the interface database in which all of the interface specifications are referenced. For all of the pieces of equipment, the definition of all of the input/output signals, in particular ARINC429, discrete, analog, RS422.

Furthermore, for the pieces of equipment 9 complying with the ARINC653 protocol, there are provided specifications of the following type: channel, apex port, partitions, modules, data structures.

This database is fed by specialists with the various functions and system architectures.

The interface requirement specifications constitute an output from the database for equipment manufacturers.

The database is transcribed into a memory that is shared for emulation of the system by the invention. The invention analyses the entire set of XML interface files and automatically generates all of the required simulation elements:

shared memories that correspond thereto and comply strictly with the electrical data;

the APIs of the ARINC653 systems; and conversion functions serving to encode/decode the "electrical data" in particular, as is used by the components of the system simulation.

The models described in high level language that come from corresponding source code generating are supplied to the shared memory without any adaptation, merely by calling the simulated APIs which are themselves strictly in compliance with the real system.

By virtue of its conformity, the shared memory relating to the electrical data may be put directly into communication with a physical interface bus, thereby enabling real pieces of equipment to be introduced into the simulation.

The simulation of the interactive environment is based on a standard real time operating system. Functions provided by the invention are in particular transcribing all of the interface data into the shared "electrical data" memory, incorporating software written in high level language in the "programmer" of the simulation environment, and making "monitoring" services available that decode electrical magnitudes in real time, thus making it possible to view parameters internal to the shared memory in understandable "engineering" magnitudes.

Services are also provided for managing real time execution tasks on the various CPUs available and the chronological sequences of the simulation models for each of these parts, and also services of encoding/decoding data interchange signals providing communication for any conventional equipment model.

APIs for the ARINC653 protocol makes communication possible for any compliance equipment model. Strict transcription of interface data and formal integration of source code derived from automatic generation make it possible faithfully to reproduce the behavior of the system or of a portion thereof in the simulation tool. The display of system parameters is provided in various ways depending on the stage of development.

Display by real-time decoding of internal parameters exchanged between the various components of the simulation is performed by direct access to the shared memory with the assistance of graphic interfaces of the simulation environment.

It is possible to use the visual formats of the man-machine interface during the stage of validating these man-machine interfaces.

The above-mentioned environment also makes it possible to manage the chronological sequences of numerous simulation models and to propose a coherent set of tools for testing and investigating each component.

All of the exchange parameters are simulated at their lowest levels, thereby accurately reproducing the formal specification of real exchanges.

The API compliant with the ARINC653 protocol makes it possible to incorporate the models corresponding to the partitions of ARINC653 equipment directly (i.e. without any manual intervention).

Nevertheless, the invention is not limited to the embodiments described. Conversely, it includes any equivalents of the described characteristics.

What is claimed is:

1. A platform for real time mixed simulation of an avionics system for an aircraft, the avionics system having equipment including at least two partitions, an avionics operating system installed on a computer, and multiple communications interfaces including a communications interface for communicating data in avionics format relating to the avionics system between said partitions, a communications interface for enabling said partitions to communicate data in avionics format relating to the avionics system with the avionics operating system, and a communications interface for communicating data in avionics format relating to the avionics system between said equipment and the outside of said equipment, the platform comprising:

a computer system including an operating system, the operating system of the computer system and the avionics operating system being of different types from one another;

a peripheral for connecting pieces of the equipment and analog or digital models and for transmitting binary, discrete, or analog data; and a shared memory environment including a shared database, a first physical memory volume for storing data that is in engineering format, and a second physical memory volume for storing data that is in avionics format;

wherein the computer system further includes a translator module, the translator module configured to, in order to have complete and consistent definitions of said communications interfaces available during the simulation, translate the communications interfaces as and when they are supplied and whenever they are varied into the form of models in a high level language on the basis of formal files in a mark-up language using the data in avionics format relating to the avionics system communicated by the communications interfaces, the translation further encoding physical behavior of said communications interfaces into the form of the models in the high level language on the basis of formal files in the mark-up language; and the translator module being further configured to dynamically manage interface descriptions of the models in the high level language that seek to group together and update interface signals and share the shared database such that the shared database incorporates, for at least some of the pieces of the equipment, encoding in the form of high level language models of all of the signals that pass via the communications interfaces;

wherein during dynamically managing the interface descriptions, the shared database feeds the simulation as a result of an automatic analysis of the interface descriptions performed during a stage of producing files in source code for the translation, said shared database providing in return services and functions that are representative of data communication exchanges within the avionics system;

wherein the translator module is further configured to perform encoding of model data from the translation into data in engineering format and to perform dynamic shared storage of the data encoded to the engineering format in the first physical memory volume and to perform decoding of data in engineering format to data in avionics format and to store the data decoded to the avionics format in the second physical memory volume.

2. The platform according to claim 1, wherein, in order to enable simulation of at least one equipment sensor component that produces information streams in the form of data in avionics or raw data format representative of an environment of the avionics system to be simulated, the translator module is further configured to encode said data from said equipment sensor component representative of interface parameters of said equipment sensor component into engineering format.

3. The platform according to claim 1, wherein, in order to enable simulation of at least one trigger component that produces data streams in the form of data in avionics or raw data format for acting on the avionics system to be simulated, the translator module is further configured to encode said data from said trigger component representative of the triggering of said trigger components into engineering format.

4. The platform according to claim 1, wherein hardware, sensing, and trigger equipment information streams are of the discrete, analog, or digital type, and are compatible with a protocol selected from the group consisting of ARINC429, ARINC653, MIL-STD-1553B, RS422, and Ethernet.

5. The platform according to claim 1, wherein during the dynamic management, the following are stored in shared manner in said shared database: interface descriptions of models of the communications architecture between or within an up-to-date set of the pieces of the equipment of the avionics system to be simulated.

6. The platform according to claim 1, wherein during dynamically managing descriptions, the translator module is further configured to, from the descriptions in shared memory in said shared database, generate interface requirement documents (IRS).

7. The platform according to claim 1, wherein the encoding provides for automatically generating data in engineering format, describing equipment interfaces that are neutral and compatible with interpretation during simulation.

8. The platform according to claim 1, wherein the dynamic management includes grouping together the interface signals in the shared database by network transmission, wired (LAN, ADSL, etc.) or wireless (Wi-Fi, WPAN, UFH, IEEE802.15.4, etc.), upstream from or during the simulation including during a stage of real or virtual connection of one of the pieces of the equipment, or during tests of the avionics system or tests of a destination aircraft.

9. The platform according to claim 1, wherein at least one of the pieces of the equipment is compatible with a protocol selected from the group consisting of ARINC429, ARINC653, MIL-STD-1553B, RS422 and Ethernet.

10. The platform according to claim 1, wherein the aircraft is selected from the group consisting of a rotary wing aircraft, a helicopter, and a hybrid helicopter.

11. The platform according to claim 1, wherein the aircraft is selected from the group consisting of an airplane and a drone.

* * * * *